United States Patent [19]
Minami

[11] 4,034,237
[45] July 5, 1977

[54] DRIVE CIRCUIT FOR ULTRASONIC LEVEL GAUGE

[75] Inventor: Hiroshi Minami, Kawasaki, Japan

[73] Assignee: Hokushin Electric Works, Ltd., Tokyo, Japan

[22] Filed: Mar. 22, 1976

[21] Appl. No.: 668,845

[30] Foreign Application Priority Data

Mar. 31, 1975 Japan .................... 50-43715[U]

[52] U.S. Cl. .................... 307/268; 307/215; 307/282; 307/225 R; 328/103; 328/119
[51] Int. Cl.² .................... H03K 5/01; H03K 13/00
[58] Field of Search .......... 328/119, 129, 130, 131, 328/156, 14, 39, 152, 103; 307/268, 215, 282, 225 R

[56] References Cited

UNITED STATES PATENTS

| | | | |
|---|---|---|---|
| 3,002,142 | 9/1961 | Jensen | 328/156 X |
| 3,050,708 | 8/1962 | van Alstyne et al. | 328/129 X |
| 3,476,957 | 11/1969 | Duckworth | 328/156 X |
| 3,660,766 | 5/1972 | Hilliard | 307/268 X |
| 3,838,414 | 9/1974 | Wiles | 328/14 X |
| 3,982,193 | 9/1976 | Maringer | 328/129 X |

Primary Examiner—John S. Heyman

[57] ABSTRACT

An AC drive circuit for exciting the transducer of an ultrasonic level gauge. The circuit includes a gate-controlled astable multivibrator that generates pulses of constant amplitude and constant frequency. These pulses are applied to a counter arrangement adapted to equalize the total amount of positive and negative half waves in the AC drive power derived from the output of the astable multivibrator.

6 Claims, 3 Drawing Figures

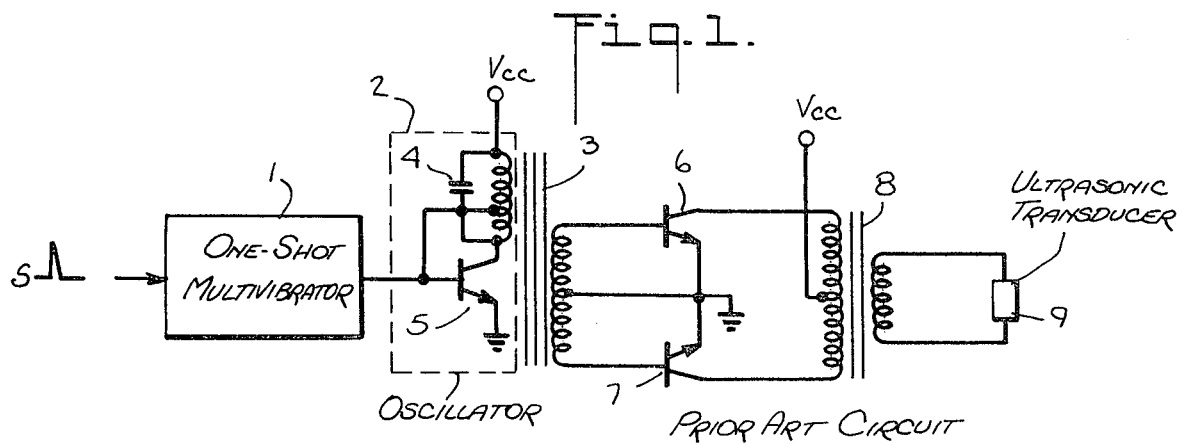
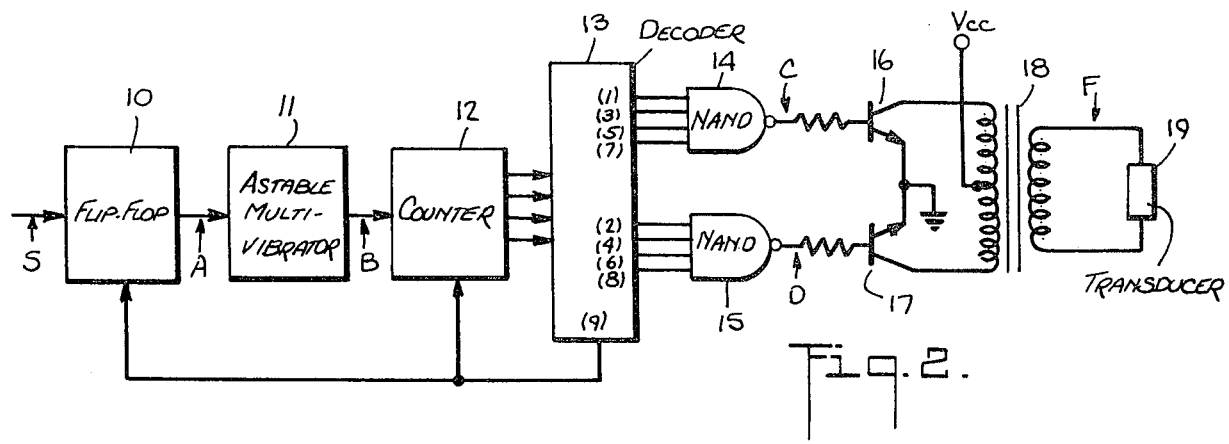
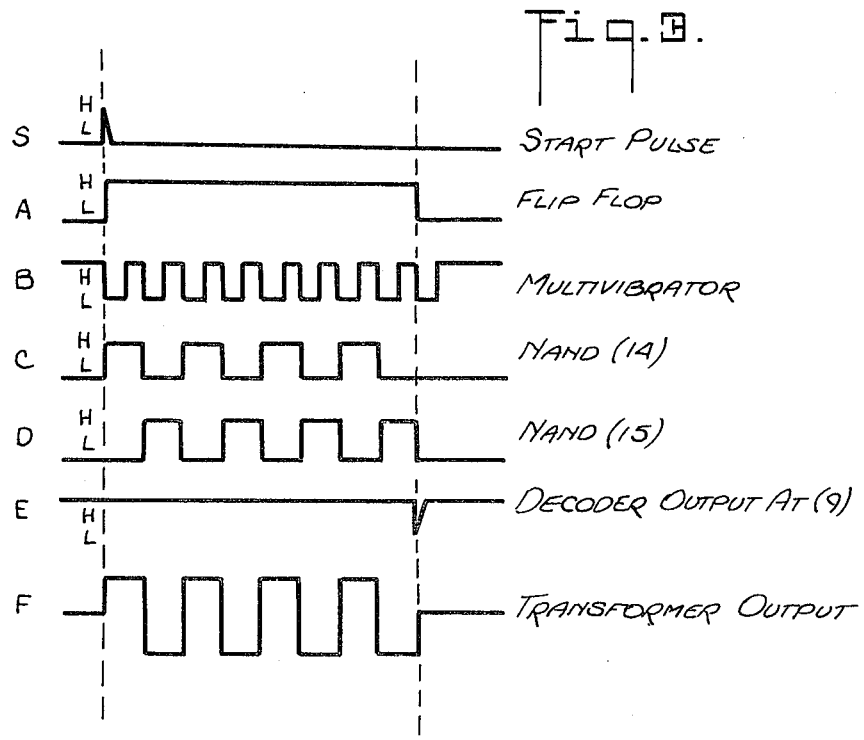

DRIVE CIRCUIT FOR ULTRASONIC LEVEL GAUGE

BACKGROUND OF INVENTION

This invention relates to a drive circuit for exciting the transducer of an ultrasonic level gauge, and more particularly to a drive circuit adapted to generate AC drive power that rises quickly at the start of transmission and falls at the end thereof.

In an ultrasonic level gauge, the distance extending between a measuring station and an object, such as the surface of a liquid, is measured by determining the elapsed transit time from the emission of an ultrasonic wave at the station and the reception thereat of the reflection of the wave from the surface of the liquid or object to be measured. It is important that the emitted ultrasonic wave rise quickly at the start of transmission and fall rapidly at the end thereof.

Effective reception of the reflected wave depends on whether the amplitude level of the reflected wave attains a reference level which is higher to a predetermined degree than the noise level. But with a conventional drive circuit which makes use of an AC oscillator having an L-C resonant circuit, the emitted wave does not rise sharply at the start of emission, nor does the reflected wave rise sharply at its beginning. Consequently, a measurement error is encountered, for variations occur in the time it takes for the reflected wave to attain the predetermined reference level.

Furthermore, when the emitted ultrasonic wave does not drop sharply at the end of transmission, it becomes difficult to measure short distances. The reason for this difficulty is that the vibrations of the ultrasonic transducer are not damped with sufficient rapidity. Also, the reflected wave and the transient at the termination of emitted ultrasonic wave are in overlapping relationship.

To overcome this rise-fall time problem, one must improve the drive circuit for exciting the ultrasonic transducer. For this purpose, it is desirable to render constant the frequency and the amplitude of the AC excitation power within the excitation period. It is also desirable to equalize the total amount of positive half waves and the total amount of negative half waves constituting the AC excitation power, so as to terminate with sufficient rapidity the vibrations of the ultrasonic transducer at the measuring station.

But with a conventional drive circuit using an AC oscillator having an L-C circuit, it takes some time for the amplitude and for the frequency of the oscillator output to attain a constant state; hence the rise time characteristic of the AC excitation power does not fulfill the requirements for an ultrasonic level gauge. Furthermore, with a conventional drive circuit, a large transient occurs at the end of the excitation.

SUMMARY OF THE INVENTION

In view of the foregoing, the main object of this invention is to provide a drive circuit for an ultrasonic level gauge, which circuit, in response to a start pulse, generates AC excitation power of constant amplitude and constant frequency.

Another object of this invention is to provide a drive circuit wherein the AC power alternations are repeated a predetermined number of times, the oscillations always terminating at a fixed phase position.

Still another object of the invention is to provide a drive circuit for an ultrasonic level gauge that renders the gauge effective in the measurement of short as well as long distances.

Briefly stated, these objects are accomplished in a drive circuit including an astable multivibrator which is gate-controlled, whereby pulses of constant amplitude and constant frequency are generated, the multivibrator acting in conjunction with a counter-decoder arrangement serving to equalize the total amount of positive half waves and the total amount of negative half waves in the AC drive power derived from the multivibrator output. The counter-decoder arrangement generates a stop signal serving to terminate the pulse output of the astable multivibrator at a fixed point.

OUTLINE OF THE DRAWING

For a better understanding of the invention as well as other objects and further features thereof, reference is made to the following detailed description to be read in conjunction with the accompanying drawings, wherein:

FIG. 1 is a schematic diagram of a conventional drive circuit which includes an L-C oscillator, the circuit producing A-C power for an ultrasonic level gauge;

FIG. 2 is a schematic diagram of a preferred embodiment of a drive circuit in accordance with the invention; and FIG. 3S and FIGS. 3A to 3F are wave forms illustrating the behavior of a drive circuit according to the invention.

DESCRIPTION OF THE INVENTION

The Prior Art

FIG. 1 shows a conventional drive circuit for an ultrasonic level gauge provided with an ultrasonic transducer. The drive circuit is triggered by a start pulse S that is applied to a one-shot multivibrator 1, the circuit further comprising an L-C oscillator 2 which includes the primary winding of a transformer 3, a capacitor 4 and a transistor 5. Associated with the oscillator is a push-pull circuit including transistors 6 and 7. An ultrasonic transducer 9 is coupled to the push-pull circuit through an output transformer 8.

The center tap of the secondary winding of transformer 3 is connected to the emitters of both transistors 6 and 7, the junction thereof being grounded to form a common terminal. The ends of the secondary winding of transformer 3 are connected to the respective bases of transistors 6 and 7. The center tap of the primary winding of the output transformer 8 is connected to a power source Vcc, and the ends of the primary winding are connected to the respective collectors of transistors 6 and 7. The secondary winding of transformer 8 is connected to ultrasonic transducer 9.

When the one-shot multivibrator 1 is triggered by start pulse S, its output is maintained at a high level for a predetermined period. During this high level period, the L-C oscillator is caused to oscillate, thereby alternately switching transistors 6 and 7 in the push-pull circuit. The resultant A-C power produced in the secondary winding of transformer 8 is applied to ultrasonic transducer 9 which emits ultrasonic energy.

Upon the conclusion of this predetermined period, the output of multivibrator 1 drops to a low level and the oscillations of the L-C oscillator cease, thereby terminating the emission of the ultrasonic wave. However, as pointed out previously, when using an L-C oscillator in a conventional drive circuit, the emitted wave does not rise sharply at the start of transmission and does not drop sharply at the termination thereof and the drive circuit therefore fails to meet the requirements of the gauge.

The Invention

Referring now to FIG. 2, there is shown an improved drive circuit for an ultrasonic level gauge. In this figure, reference numeral 10 designates a flip-flop, numeral 11 refers to an astable multivibrator, numeral 12 to a pulse counter and numeral 13 to a decoder. The numerals 14 and 15 refer to NAND circuits, numerals 16 and 17 to transistors which constitute a push-pull circuit, numeral 18 to an output transformer and numeral 19 to an ultrasonic transducer.

Astable multivibrator 11 is gate-controlled by the output of flip-flop 10. The output of astable multivibrator 11 is applied to pulse counter 12. Decoder 13 receives the output of counter 12, thereby generating rectangular pulses which assume a high level corresponding to the low level of the input pulses. The odd-numbered output terminals (1), (3), (5) and (7) of the decoder are connected to the gate of the NAND circuit 14 and the even-numbered output terminals (2), (4), (6), and (8) are connected to the gate of the NAND circuit 15.

Output terminal (9) of decoder 13 is connected to flip-flop 10 and to the clear or reset terminal of counter 12. The output terminals of NAND circuits 14 and 15 are connected to transistors 16 and 17 respectively, whose emitters are connected together and grounded thereby forming a common terminal. The center tap of the primary of transformer 18 is connected to a power source Vcc, and the ends of the primary winding of a transformer 18 are connected to the respective collectors of transistors 16 and 17. The secondary winding of the transformer 18 is connected to ultrasonic transducer 19.

Operation

We will now explain in greater detail in connection with FIG. 3S and FIGS. 3A to 3F the behavior of the drive circuit shown in FIG. 2. FIG. 3S shows the form of the start pulse which is applied to flip-flop 10 and FIG. 3A shows the output of this flip-flop. FIG. 3B shows the output of astable multivibrator 11. FIGS. 3C and 3D show the outputs of the NAND circuits 14 and 15, respectively. FIG. 3E shows the output yielded at terminal (9) of decoder 13. FIG. 3F shows the output of power transformer 18.

Flip-flop 10 is triggered by start pulse S shown in FIG. 3S, and the output thereof goes abruptly from a low level (L) to a high level (H), as shown in FIG. 3A, where it will be seen that the leading edge of the flip-flop output is coincident with the start pulse.

In response to the output of flip-flop 10, astable multivibrator 11 proceeds to oscillate, and the resultant pulses, as shown in FIG. 3B, are counted by counter 12. Then in decoder 13, when the pulse count reaches some odd number such as 1, 3, 5 or 7, the output of one of the counter terminals (1), (3), (5) and (7) which corresponds to the count, assumes a low level, and in response thereto the output of NAND circuit 14, wherein a negative logical sum operation is carried out, then assumes a high level (H) as shown in FIG. 3C.

On the other hand, when the count produced by counter 12 attains some even number such as 2, 4, 6 or 8, the output of one of the decoder terminals (2), (4), (6) and (8) which corresponds to this count assumes a low level, and the output of the associated NAND circuit 15 attains a high level (H) as shown in FIG. 3D.

Consequently, transistors 16 and 17 are switched on alternately by the NAND gates and the resultant alternating-current, as shown in FIG. 3F, flows in the secondary winding of transformer 18. The excitation AC power produced by transformer 18 is applied to the ultrasonic transducer 19, thereby emitting an ultrasonic wave.

When the count in counter 12 becomes 9, the output of terminal (9) in the decoder 13 falls to a low level (L) as shown in FIG. 3E, and in response to this termination signal, flip-flop 10 and counter 12 are cleared or reset. As a result, the output of flip-flop 10 falls to low level (L) and astable multivibrator 11 ceases to oscillate, thereby terminating the emission of the ultrasonic wave by transducer 19.

Generally speaking, when the value counted by the counter 12 becomes some odd number represented by $(2m - 1)$, wherein $m$ represents a positive integer, then transistor 16 is switched on, and when the counted value becomes some even number represented by $(2m)$, then transistor 17 is switched on. And, when the counted value reaches a maximum number represented by $(2n + 1)$, wherein $n$ represents the maximum of $m$, the flip-flop 10 and the counter 12 are automatically reset.

Though in the embodiment illustrated in FIG. 2 the output of decoder 13 is applied to NAND circuits 14 and 15, wherein negative-or operations are carried out, and the outputs then yielded are fed to the transistors 16 and 17, it is possible to drive these transistors by the use of the output of a first stage flip-flop constituting the counter 12. In this case, the circuit is so arranged that the output of the first stage flip-flop in the counter 12 is applied directly to the transistor 16, and the identical output is applied to the transistor 17 in a negative logical manner.

Furthermore, though in the embodiment shown in FIG. 2, the astable multibvibrator 11 is employed as a rectangular pulse oscillator, the circuit may be replaced with other circuits such as a circuit in which the start and conclusion of the oscillation may be readily controlled and whose oscillating frequency is constant.

It will be apparent from the foregoing that a drive circuit for an ultrasonic transducer in accordance with the present invention possesses the following features:

A. Because an astable multivibrator is used as an oscillating source, the drive circuit generates constant amplitude and constant frequency pulses from the start of transmission; hence the measuring efficiency is markedly improved because of the sharp rise time characteristic thereof.

B. Because a counter is used so as to equalize the total amounts of the positive and negative half waves in the AC excitation power, the vibrations of the ultrasonic transducer are damped with sufficient rapidity. As the result, it becomes possible to use this circuit for a short distance measuring device.

C. Because the astable multivibrator is used in place of an L-C oscillator in the conventional circuit, the oscillating frequency may be readily changed over the wide frequency range as compared with a conventional oscillator.

D. Because the timing to clear the flip-flop and the counter can be selected at will, the number of the ultrasonic waves may be readily changed.

While there have been shown and described preferred embodiments of a drive circuit for ultrasonic level gauge in accordance with the invention, it will be appreciated that many changes and modifications may be made therein without, however, departing from the essential spirit thereof.

I claim:

1. A drive circuit for supplying AC power having a sharp rise at the beginning of transmission and a sharp fall at the end thereof to excite an ultrasonic transducer transmitting an ultrasonic wave or the like, said circuit comprising:
   A. a gate-controlled astable multivibrator producing during a gate period initiated by a start pulse a train of rectangular pulses of constant amplitude and constant frequency;
   B. a counter coupled to the multivibrator to count the pulses produced thereby;
   C. decoder means coupled to the counter to produce a first set of rectangular output pulses in response to oddnumbered counts and a second set of rectangular output pulses in response to even-numbered counts;
   D. means alternately actuated by output pulses of the first and second sets to yield said AC power in the form of bipolar rectangular pulses whose frequency is one-half said constant frequency; and
   E. means for terminating said gate period when said decoder means produces a reset pulse representing a predetermined maximum count.

2. A drive circuit as set forth in claim 1 wherein said multivibrator is gate-controlled by a flip-flop which is actuated by said start pulse and reset by said reset pulse, said reset pulse being also applied to said counter.

3. A drive circuit as set forth in claim 1 wherein said decoder means includes a first NAND gate responsive to said odd numbered counts and a second NAND gate responsive to said even-numbered counts.

4. A drive circuit as set forth in claim 3, wherein said NAND gates are coupled to a push-pull transistor circuit constituting said alternately-actuated means.

5. A drive circuit as set forth in claim 1 wherein means are alternately actuated when the count becomes $(2m - 1)$ or $(2m)$ where $m$ is a positive integer.

6. A drive circuit as set forth in claim 5 wherein said maximum count is attained when the value reaches $(2n + 1)$, when $n$ represents the maximum of $m$.

* * * * *